United States Patent [19]

Roberts

[11] 4,427,955
[45] Jan. 24, 1984

[54] CAPACITOR STRUCTURE FOR INTEGRATED MULTI-STAGE FILTER

[75] Inventor: Victor D. Roberts, Burnt Hills, N.Y.

[73] Assignee: General Electric Company, Schenectady, N.Y.

[21] Appl. No.: 320,253

[22] Filed: Nov. 12, 1981

[51] Int. Cl.³ .............................................. H03H 7/09
[52] U.S. Cl. .................................... 333/177; 333/181; 333/185; 315/239; 315/244
[58] Field of Search .................... 333/167, 176–177, 333/181, 184, 185; 315/239, 244, 278; 336/178, 212, 214; 323/205, 206, 208; 361/301, 304, 311

[56] References Cited

U.S. PATENT DOCUMENTS

| | | | |
|---|---|---|---|
| 2,380,522 | 7/1945 | Haug | 323/206 |
| 2,626,317 | 1/1953 | Malm | 333/181 |
| 4,327,311 | 4/1982 | Wroblewski | 315/244 |

Primary Examiner—Marvin L. Nussbaum
Attorney, Agent, or Firm—William H. Steinberg; James C. Davis, Jr.; Marvin Snyder

[57] ABSTRACT

A capacitor structure comprises a single sheet of spirally-wound conductive material having an insulative layer disposed on one side. In contrast to previously-employed capacitor structures, the structure of the present invention includes only a single conductive sheet of material not a plurality of conductive plates or layers. In particular, the present invention is readily employable in magnetic circuits, particularly those employing magnetic core material. In these circuits, the capacitor is installed without the requirement of external leads and is readily integrated with the core structure. The instant capacitor structure is also particularly useful in constructing multi-stage LC filter circuits.

6 Claims, 3 Drawing Figures

CAPACITOR STRUCTURE FOR INTEGRATED MULTI-STAGE FILTER

BACKGROUND OF THE INVENTION

The present invention relates to capacitor structures and to magnetic circuits employing capacitive elements.

The paradigm of capacitor structures is that in which at least a pair of conductive sheets or plates are adjacently disposed with at least one layer of dielectric material between them. In such structures, alternate plates or layers are often connected by means of a common electrical lead so as to form a device exhibiting a certain capacity per unit volume. In general, the capacitance of such a perma structure is governed by its geometry and the electrical permittivity of the dielectric material between the plates. More particularly, the capacitance is generally linearly proportional to the area of the plates employed and inversely proportional to the separation distance between the plates. Nonetheless, in known prior art capacitor structures, the requirement for at least a pair of electrically-insulated and separate conductors has been present.

The construction of multi-stage filters is also generally well known in the electrical arts. In particular, the construction of inductor-capacitor (LC) multi-stage, low pass filters is well known. Such filters generally are often configured in a ladder network in which capacitive elements are employed as the rungs, or shunt elements, of the circuit. Similarly, inductive elements are generally employed as the series elements in such circuits. These circuits are particularly useful in inverter applications in which a direct current signal is "chopped" into a plurality of rectangular pulse-like signals for passage through and control by inductive circuit elements. The high speed chopping circuit often, however, introduces unwanted high frequency signal components. It is the low pass filters mentioned above which are particularly useful in eliminating, or at least mitigating, the effects of these high frequency components. In such inverter circuits, particularly those employed in electronic discharge lamp ballast configurations, it is also desirable that the overall circuit configuration be small, compact and light-weight. It is therefore desirable to be able to integrate as many components as possible into as few structures as possible.

In application Ser. No. 292,322, filed in 1981, titled "Integrated Transformer and Inductor", the instant inventor teaches that the use of gapped legs in magnetic core circuits can effectively provide inductive components for filter circuits, particularly filter circuits such as are considered herein. Accordingly, because of these teachings, the aforementioned application is hereby incorporated herein by reference. Furthermore, in U.S. patent application Ser. No. 243,324, titled "A Ballast Circuit For Driving a Plurality of Fluorescent Lamps", the instant inventor also teaches that integrated magnetic circuits having gapped legs are employable in ballast circuits for fluorescent lamps. Accordingly, because of related teachings therein, the aforementioned patent application is also incorporated herein by reference. However, in these two prior submitted applications, it is to be noted that in each case, the capacitive elements are provided in the same manner. That is to say, in each case a separate and distinct capacitance is provided by employing a conventional capacitor connected across the winding disposed on an appropriate portion of the transformer core. In the present invention, this winding and capacitive element are integrated into a single structure. This structure is lower in cost since the winding required for coupling the capacitor to the magnetic structure is eliminated. The structure of the instant invention is also unique in that connection of conventional leads is not required. In spite of the apparently intuitive notion that such a device will not operate as a capacitor since no external electrical connections are provided and since there is only a single conductive sheet, nonetheless the present invention acts as a conventional capacitor when used in connection with a magnetic structure.

SUMMARY OF THE INVENTION

In accordance with a preferred embodiment of the present invention, a capacitor for use on a core of magnetic material comprises a single sheet of spirally-wound conductive material having an insulative layer disposed on one side, with the wound sheet having an axially-oriented aperture for insertion of the core material. In accordance with a preferred embodiment of the present invention, the capacitor structure is disposed on a nonconductive sleeve into which a core of high magnetic permeability material may be inserted. In another embodiment of the present invention, the capacitor structure disclosed herein is employed in a multi-stage filter circuit to effectively act as an integrated low pass filter, having as many stages as desired.

Accordingly, it is an object of the invention to provide a capacitor structure which is particularly useful in electrical circuits employing magnetic core material.

It is also an object of the present invention to provide an integrated, inductive-capacitive, low pass filter which is particularly useful in electrical inverter circuits.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in conjunction with the accompanying drawings in which:

DETAILED DESCRIPTION OF THE INVENTION

Figure 1:
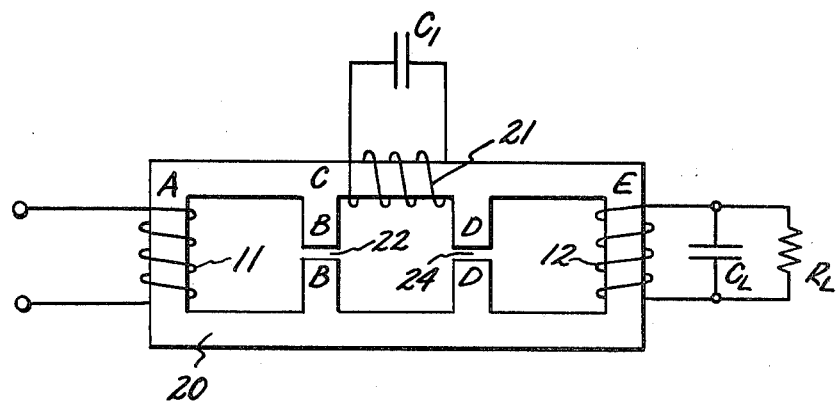
FIG. 1 is an electrical circuit schematic diagram illustrating an integrated multi-stage filter previously disclosed by the present inventor.

FIG. 1 illustrates a previously-disclosed integrated multi-stage filter circuit. In particular, the circuit includes core 20 which comprises a material exhibiting a high magnetic permeability. This core has leg A about which primary winding 11 is disposed. The core also possesses a second leg portion E about which a secondary winding 12 is disposed. Furthermore, across secondary winding 12 there are disposed a capacitor $C_L$ and a resistive load $R_L$. As part of the integrated features of the filter shown, core 20 also possesses gapped leg B and gapped leg D with gaps 22 and 24, respectively, as shown. These gapped legs provide the desired series inductive elements for the multi-stage ladder network filter. For purposes of clarity of description herein, it is to be noted that legs A and B of the core structure are part of a single magnetic flux loop path. Legs B, C and D are in another loop. These two loops are further described herein as being adjacent. Each has leg B in common with the other loop. Additionally, a shunt capacitance, governed by the value of capacitor $C_1$ is provided in the manner shown. That is to say, capacitor $C_1$ is connected directly across separate winding 21 on portion C of core 20. The actual effective shunt capacitance is determined by the number of turns on winding 21, as well as by the number of turns on windings 11 and 12. It should be noted that such a circuit as described in FIG. 1 not only effectively operates as an integrated multi-stage filter, but also performs functions performed by transformer circuits. However, with particular regard to the present invention, it is to be especially noted that the shunt capacitance in FIG. 1 is provided by two distinct circuit elements, namely, winding 21 and capacitor $C_1$. In the structure of FIG. 1, winding 21 must be disposed on core portion C and capacitor $C_1$ connected thereto through its attached leads. However, as seen below, the present invention provides for a shunt capacitance in a single structure which achieves even greater levels of integration and, furthermore, eliminates the need for the connection of external capacitor leads.

Several variations of the circuit shown in FIG. 1 are possible without departing from the essence of the structure shown. In particular, capacitor $C_L$ also acts as a shunt capacitance and could just as easily have been disposed about core portion E using a separate winding, distinct from secondary winding 12. However, while such a structure may possess advantages in more particularly being able to select the voltage rating for capacitor $C_L$, it also should be noted that a separate winding structure for $C_L$ may be more costly and more inconvenient because of the extra winding required. However, in certain situations such as that mentioned above, these disadvantages may be outweighed.

Additionally, with respect to the circuit shown schematically in FIG. 1, it is to be noted that certain other variations may also be employed without departing from the essential mode of operation of the circuit shown. In particular, leg A could be a gapped leg without primary winding 11 and leg B could be an ungapped leg on which a primary winding is employed. Likewise, secondary winding 12 could be disposed about an ungapped leg D with the gap instead being in leg E. In either of these two cases the fundamental operation of the circuit is unchanged.

Figure 2:
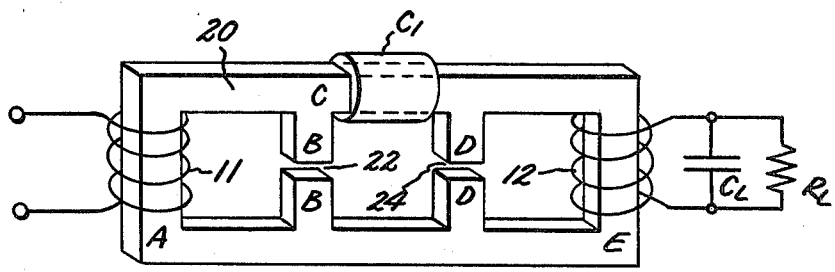
FIG. 2 is a partially isometric and partially schematic diagram illustrating a multi-stage filter in which a separate capacitor and winding circuit is replaced by a single integrated structure.

FIG. 2 illustrates an embodiment of the present invention in which capacitor $C_1$ is disposed about core portion C in the manner more particularly shown in FIG. 3, which is discussed below. The essential difference between the circuit shown in FIGS. 1 and 2 is that the shunt capacitance $C_1$ is now incorporated in a single structure which does not require separate components for capacitor $C_1$ and winding 21. All of the structures are integrated into the single structure illustrated in FIGS. 2 and 3. Thus, the device of FIGS. 2 and 3 provides an even greater level of integration.

Figure 3:
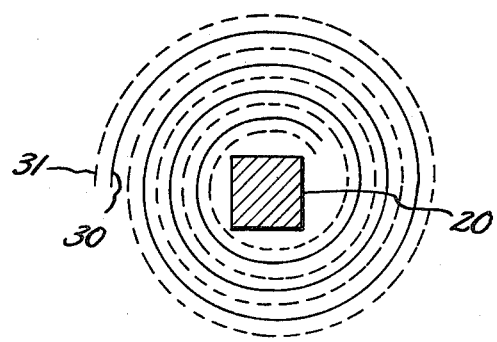
FIG. 3 is a cross-sectional view through the capacitive structure of the present invention.

The actual structure employed for capacitor $C_1$ in FIG. 2 is more particularly illustrated in FIG. 3 where it is seen that capacitor $C_1$ in FIG. 2 actually comprises a single sheet 30 of spirally-wound conductive material having an insulative layer 31 disposed on one side of it. The wound sheet possesses an axially-disposed aperture for insertion of the core material 20. In point of fact, core 20 may be fashioned in a segmented form, in which case, it is preferable that the capacitor structure disclosed be wound on a nonconductive sleeve into which the core material is inserted. If core 20 does, in fact, comprise a monolithic structure, then it is preferable that the single sheet with its insulating layer be wound directly on the desired portion of the core 20.

While the present Figures illustrate the use of the present invention in an integrated two-stage filter, it is quite possible to extend the present concept to multi-stage filters in which additional stages are provided by employing additional gapped legs with capacitor structures such as that shown in FIG. 3 disposed on core portions between adjacent pairs of gapped legs. Each additional gapped legs increases the total count of adjacent magnetic flux loop paths. The capacitor of the present invention is a nonterminated, that is, open, winding designed specifically to maximize the self-capacitance of the spiral winding. To achieve this, the conductive sheet and the insulating material employed is only sufficiently thick enough to accommodate the capacitor voltage and current rating.

In a standard capacitor, voltage is applied to conductive plates or sheets separated by an insulator. In this new capacitor only a single conductor is used. This is a highly unique form of capacitor structure. It is particularly employable in electrical circuits having high permeability magnetic core structures for the following reason. A time-varying magnetic field produced by magnetic flux within the core material produces a time-varying magnetic field passing through the spiral path formed by the sheet-wound conductor and creates a potential difference between adjacent turns, so that current "flows through" the dielectric material. This device then acts as a conventional capacitor connected to a winding on the leg of a magnetic structure. The capacitor of the present invention is significantly different from the parasitic capacitances which can arise in conventional windings insulated with dielectric materials. Most notably, the capacitor of the present invention is intentionally provided and has no external connections. It also possesses the advantage that the sheets can be made thin since no load current flows in these conductors. This is not the situation that exists for the current found in parasitically occurring capacitors.

Accordingly, from the above it is seen that the capacitor structure of the present invention provides a simple and economical means for achieving an even higher degree of integration in certain low pass filter networks. The apparatus of the present invention provides a low cost system since at least one winding is eliminated in each filter stage. The cost advantages of the present invention increase with the number of stages employed in the filter circuit.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A capacitor for use on cores of material having a high magnetic permeability and capable of being excited by a time varying magnetic field, said capacitor comprising:
- a single sheet of spirally-wound conductive material having an insulative layer disposed on one side thereof, said wound sheet having an axially-oriented aperture therein for insertion of said core material, said wound sheet having currents induced therein by said time varying magnetic field passing through the axially-oriented aperture of said wound sheet.

2. The capacitor structure of claim 1 in which said sheet is wound on a nonconductive sleeve.

3. An integrated structure comprising:
- a core of high magnetic permeability material, said core capable of being excited by a time varying magnetic field; and
- a single sheet of spirally wound conductive material having an insulative layer oriented on one side thereof, said wound sheet having an axially-disposed aperture therein in which said core material is disposed, said wound sheet having currents induced therein by said time varying magnetic field passing through the axially disposed aperture.

4. An integrated two-stage filter comprising:
- a closed loop core of high magnetic permeability material having a primary winding at a first end of said core and a secondary winding at a second end of said core, said core capable of being excited by a time varying magnetic field;
- a pair of gapped legs in said core disposed so as to form with said core, a total of three adjacent magnetic flux loop paths, including paths crossing said gaps; and
- a single sheet of spirally-wound conductive material having an insulative layer disposed on one side thereof, said wound sheet being disposed around a portion of said core between said pair of gapped legs, said wound sheet having currents induced by said time varying magnetic field passing therethrough.

5. An integrated multi-stage filter comprising:
- a closed loop core of high magnetic permeability material having a primary winding at a first end of said core and a secondary winding at a second end of said core, said core capable of being excited by a time varying magnetic field;
- a plurality, n, of gapped legs disposed so as to form, with said core, a total of (n+1) adjacent magnetic flux loop paths, including paths crossing said gaps; and
- at least one single sheet of spirally-wound conductive material having an insulative layer disposed on one side thereof, said wound sheet being disposed around a portion of said core between an adjacent pair of gapped legs, said wound sheet having currents induced therein by said time varying magnetic field passing therethrough.

6. The filter of claim 5 in which each pair of adjacent gapped legs possesses a single sheet of spirally-wound conductive material having an insulative layer disposed on one side thereof, disposed around a portin of said core between said adjacent pair of gapped legs.

* * * * *